(12) United States Patent
Srinivasan et al.

(10) Patent No.: US 8,160,520 B2
(45) Date of Patent: Apr. 17, 2012

(54) SUPPLY CONTROL FOR MULTIPLE POWER MODES OF A POWER AMPLIFIER

(75) Inventors: Vishnu Srinivasan, Austin, TX (US); David E. Bockelman, Dripping Springs, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 997 days.

(21) Appl. No.: 12/151,812

(22) Filed: May 9, 2008

(65) Prior Publication Data
US 2009/0278609 A1 Nov. 12, 2009

(51) Int. Cl.
*H04B 1/04* (2006.01)

(52) U.S. Cl. .................. 455/127.3; 455/127.5

(58) Field of Classification Search .......... 455/550.1, 455/552.1, 574, 115.1, 127.1, 127.2, 127.4, 455/127.5, 127.3; 330/10, 136, 297
See application file for complete search history.

(56) References Cited

U.S. PATENT DOCUMENTS

| | | |
|---|---|---|
| 4,580,111 A | 4/1986 | Swanson |
| 4,593,251 A | 6/1986 | Smith |
| 4,680,559 A | 7/1987 | Swanson |
| 5,872,481 A | 2/1999 | Sevic et al. |
| 6,069,525 A | 5/2000 | Sevic et al. |
| 6,731,166 B1 | 5/2004 | Sabouri et al. |
| 6,996,379 B2 | 2/2006 | Khorram |
| 7,095,283 B2 | 8/2006 | Kee et al. |
| 7,129,784 B2 | 10/2006 | Bhatti et al. |
| 7,157,965 B1 | 1/2007 | Kim |
| 7,215,206 B2 | 5/2007 | Dupuis et al. |
| 2005/0064830 A1* | 3/2005 | Grigore ............... 455/127.4 |
| 2006/0270366 A1* | 11/2006 | Rozenblit et al. ....... 455/127.1 |
| 2009/0004981 A1* | 1/2009 | Eliezer et al. ........... 455/127.1 |

OTHER PUBLICATIONS

U.S. Appl. No. 12/151,199, filed May 5, 2008, Entitled "Controlling Power With An Output Network," by Vishnu Srinivasan, et al.
U.S. Appl. No. 12/317,819, filed Dec. 30, 2008, Entitled "An Output Gain Stage for a Power Amplifier," by Vishnu Srinivasan, et al.
RF Micro Devices, Inc., "RF2173, 3V GSM Power Amplifier, Package Style: QFN, 16-Pin, 4×4," 2006, pp. 1-14.
RF Micro Devices, Inc., "What's Next in UMTS Front-Ends," 2007, pp. 1-2.
Anadigics, "AWT6278R, HELP3™ PCS/WCDMA 3.4 V/29.5 dBm, Linear Power Amplifier Module, Data Sheet—Rev. 2.0," Jan. 2007, pp. 1-8.

* cited by examiner

Primary Examiner — Thanh Le
(74) Attorney, Agent, or Firm — Trop, Pruner & Hu, P.C.

(57) ABSTRACT

In one embodiment, the present invention includes an apparatus having at least two gain stages to receive incoming signals and to output amplified signals, along with multiple regulators. More specifically, a linear regulator can be coupled to the first gain stage to provide a first regulated voltage to the first gain stage, and a switching regulator coupled to the second gain stage to provide a second regulated voltage to the second gain stage.

23 Claims, 6 Drawing Sheets

SUPPLY CONTROL FOR MULTIPLE POWER MODES OF A POWER AMPLIFIER

BACKGROUND

Power amplifiers (PAs) are used in wireless devices to amplify a radio frequency (RF) signal to a desired output power level for transmission from the wireless device. Different wireless communication systems have different requirements for output power levels. In some systems, the dictated power levels may vary from low power levels to high power levels, depending on a type of communication that is occurring. For example, different communication systems such as enhanced data rates for GSM evolution (EDGE), long term evolution (LTE/4G), WiFi in accordance with an IEEE 802.11 standard, worldwide interoperability for microwave access (WiMax), code division multiple access (CDMA), and wideband-code division multiple access (W-CDMA), all have different power requests. In certain systems, the portable transmitter may have two or more power modes wherein each mode has a different maximum output power capability. For example, a transmitter may have a high power mode with a maximum output power of 27 dBm, a medium power mode with a maximum of 17 dBm and a low power mode with a maximum of 7 dBm. With such a system, energy used from the battery can be conserved when lower powers are transmitted.

In typical wireless implementations, an output load presented to the PA is typically 50 ohms. The relationship between the output power, load, and voltage switching may be determined in accordance with the following equations:

$$P_{out} = \frac{V_{o,rms}^2}{R_L}$$

(where $P_{out}$ is output power, $V_{o,rms}$ and $V_{o,pk}$ are output voltage RMS and peak values, and $R_L$ is load resistance).

In turn, the efficiency, $\eta$, of a PA, which is desirably as high as possible, is derived as the ratio of output power to the power consumed from the supply voltage:

$$\eta = \frac{P_{out}}{P_{sup}},$$

where $P_{sup} = V_{sup} \cdot I_{sup}$, where $I_{sup}$ is the current drawn from a supply (such as a battery) and may be supplied to a regulator device, and $V_{sup}$ is the supply voltage.

If any voltage ($\Delta V$) is dropped across a linear regulator, also known as a Low Dropout Regulator (LDO), it results in power dissipated (or lost) in the regulator. Such losses directly impact the total PA efficiency. Thus, in the case of LDOs, for a high efficiency implementation, the output voltage of the LDO (which is the Vdd for the PA circuits) should be maximized with as little voltage dropped across the regulator as possible. For a given load, this however determines the maximum power that can be delivered to the load. To lower output power (Pout), the input signal level can be reduced (a.k.a. power backoff) at the cost of much reduced efficiency. To efficiently control the Pout delivered to the load, the Vdd (or Vpa) needs to be lowered. This backoff in power, if accomplished with a linear regulator, will result in a large voltage drop ($\Delta V$), resulting in low PA efficiency.

Accordingly, to attempt to maintain efficiency, most PAs adjust the supply voltage level by means of a switching regulator which is used to supply the variable voltage level for the desired Pout levels. The key characteristic of a switching regulator (also known as a DC/DC regulator) is that it transforms the supply (or battery) voltage to a different voltage (e.g., Vdd for the PA) with minimal power loss. Because of the characteristics of such a DC/DC switching regulator, large off-chip components such as an inductor are needed, as significant current needs to be supplied to the PA for the high power mode. Furthermore, because of the switching frequency of the switching regulator, large spurs may exist, at the harmonics of the switching frequency that can cause noise at the PA output. Still further, there is always an efficiency impact due to the DC/DC converter, and a more complex feedback mechanism or other control (such as factory calibrations) that are needed to properly control the output voltage of the switching regulator for a desired output power.

SUMMARY OF THE INVENTION

In one aspect, the present invention includes an apparatus having at least two gain stages to receive incoming signals and to output amplified signals, and multiple regulators. More specifically, a linear regulator can be coupled to the first gain stage to provide a first regulated voltage to the first gain stage, and a switching regulator coupled to the second gain stage to provide a second regulated voltage to the second gain stage. In some implementations, the regulated voltages can be switchably coupled to the corresponding gain stage based on an output power level to be achieved. According to some control schemes, the linear regulator can be controlled to provide the first regulated voltage at a fixed level and the switching regulator controlled to provide the second regulated voltage at a variable level.

Another aspect of the present invention is directed to a power amplifier that includes an amplifier to receive an incoming signal and to output an amplified signal, a low dropout (LDO) regulator switchably coupled to the amplifier to provide a first regulated voltage to the amplifier and a switching regulator switchably coupled to the amplifier to provide a second regulated voltage to the amplifier. In one such implementation, the regulators are coupled in parallel to the amplifier, and only a single one of the regulators is enabled at a time.

Yet another aspect of the present invention is directed to a method for controlling a power amplifier to output a first power level according to a digital control signal and controlling the power amplifier to output a second power level according to an analog control signal. The power amplifier may be powered by a switching regulator under control of the analog control signal, and by a linear regulator under control of the digital signal. Based on the analog control signal, an output voltage of the switching regulator can be varied to in turn vary the output power of the power amplifier.

A still further aspect of the present invention is directed to a system that includes a baseband processor to control system operation, a transceiver coupled to the baseband processor to receive baseband information and to generate a radio frequency (RF) signal, and a power amplifier (PA) coupled to the transceiver to receive and amplify the RF signal to a transmit power level under control of the baseband processor. The PA includes at least one gain stage to operate using different supply voltages to output the RF signal at a different power levels. At least one of the supply voltages may be at a fixed level and at least another at a variable level less than the fixed level.

DETAILED DESCRIPTION

In various embodiments, multiple voltage regulator devices may be provided for a power amplifier. Specifically, both a linear regulator such as a low drop out (LDO) regulator and a switching regulator such as a DC/DC switching regulator may be provided. In certain implementations, both such regulator devices may be formed on a single semiconductor die, along with the remaining portion of the PA. Such multiple regulator devices may be used to power one or multiple gain stage paths of the PA. As will be discussed further below, in some implementations each regulator may be coupled to a dedicated path to provide for differing power levels for output from the PA. In other implementations, at least one of the voltage regulator devices may be shared by such multiple paths.

Figure 1:
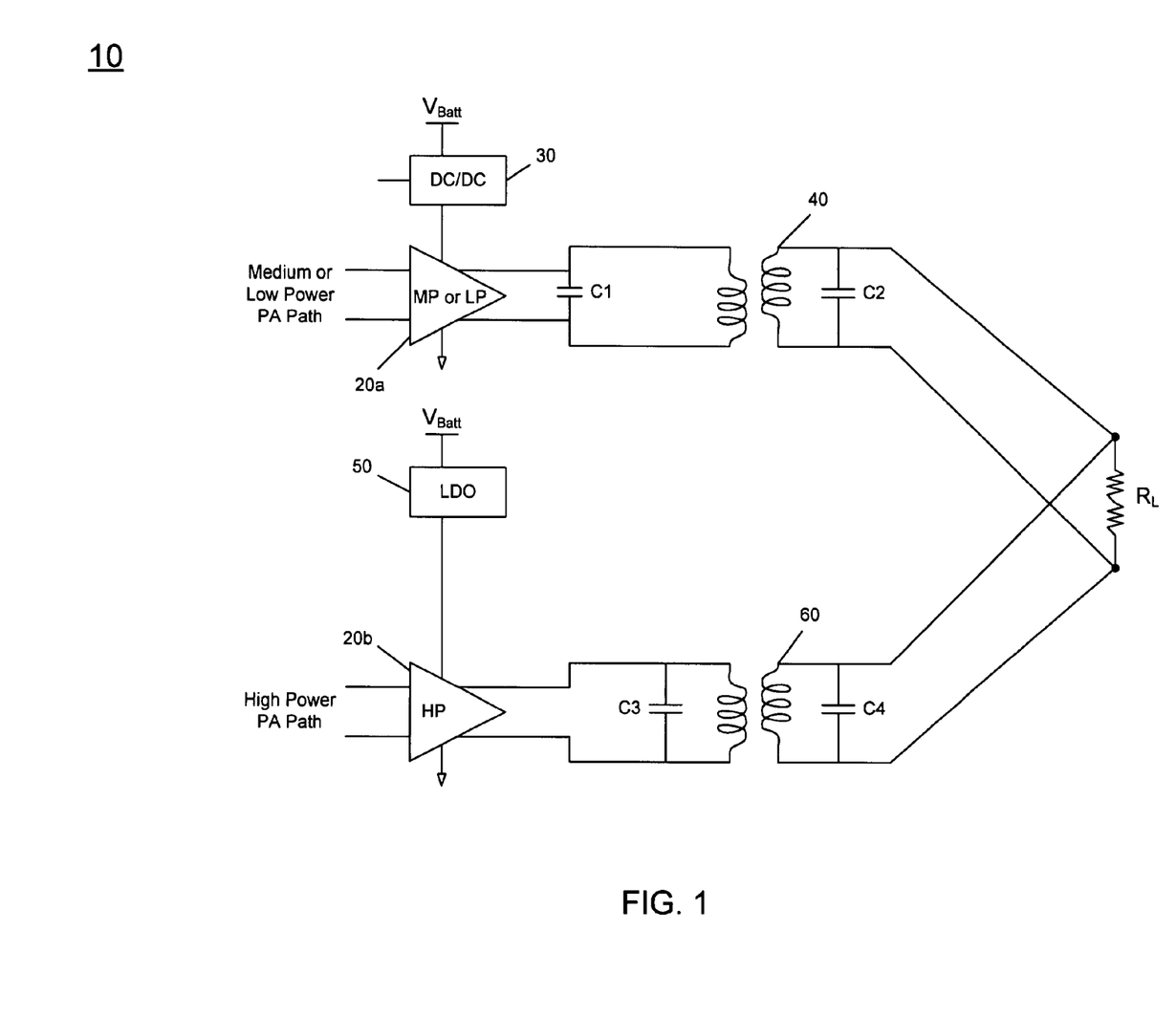
FIG. 1 is a conceptual schematic diagram of a portion of a power amplifier in accordance with one embodiment of the present invention.

Referring now to FIG. 1, shown is a conceptual schematic diagram of a portion (corresponding to the output stage) of a power amplifier in accordance with one embodiment of the present invention. As shown in FIG. 1, PA 10 includes multiple parallel paths. Specifically, as shown in FIG. 1 a medium or low power path includes a first gain stage $20_a$, which may be used to provide power amplification in a low power mode or medium power mode. A second path, namely a high power path, includes a second gain stage $20_b$ that is used to provide power amplification in a high power mode. In this embodiment, the purpose of the two paths is to provide different drive-point impedances to each of the gain stages, thus providing a highly efficient means to reduce Pout from high power mode to medium power mode. Gain stages 20 may be formed of complementary metal oxide semiconductor (CMOS) amplifiers. For example, in one embodiment each such gain stage may be formed of an N-channel metal oxide semiconductor field effect transistor (NMOS and MOSFET) and a P-channel MOSFET (PMOS). Still further, in certain implementations each such gain stage may be a differential gain stage having pairs of such complementary PMOS and NMOS devices. While described herein as a CMOS implementation, it is to be understood that the scope of the present invention is not limited in this regard.

Note for purposes of discussion, the terms medium power (MP) and low power (LP) can be used synonymously to indicate a power level less than a high power (HP) level. In one such embodiment high power may be between approximately 17 to 27 dBm, medium power may be between approximately 7 to 17 dBm, and low power may be less than 7 dBm.

As shown in FIG. 1, gain stage $20_a$ is powered by a DC/DC switching regulator (hereafter switching regulator) 30, while gain stage $20_b$ is powered by a LDO regulator 50. The LDO regulator 50 drops the excess voltage between $V_{Batt}$ and Vdd (which is the supply for the PA core circuits) on an active device and the power dissipated in the regulator effectively reduces the PA efficiency. At typical battery voltage and maximum output power conditions, the Vdd is very close to the $V_{Batt}$, and hence the efficiency impact is small. (Under special conditions, such as during battery charging, $V_{Batt}$ can be somewhat higher than Vdd, and the LDO regulator 50 may provide over-voltage protection for the gain stages.) If Vdd is reduced by means of the LDO regulator 50 in order to reduce Pout, then Vdd will be significantly smaller than $V_{Batt}$.

A switching regulator on the other hand, uses active devices as switches that are either fully ON or fully OFF and by pulse-width modulation with the appropriate duty-cycle to provide the required voltage to the PA. The main losses incurred in a switching regulator are due to parasitics and the achievable efficiencies are typically about 90%.

In one embodiment, a lower switch point, i.e., the low power mode, can be supported by controlling the output voltage of a switching regulator 30. In such an embodiment, two distinct voltage levels would be chosen to program the gain stage in medium power mode, or the low power mode. By using a switching regulator instead of a LDO, there is little impact to the efficiency in the low power mode, even though Vdd is much smaller than the $V_{Batt}$. In yet another embodiment, the control for switching regulator 30 may be continuous analog control such that by adjusting the control to switching regulator 30, varying levels of medium to low power can be realized. In such an embodiment, the voltage control of switching regulator 30 can be exposed to the (customer) baseband processor. Such "analog" control of switching regulator 30 can maintain optimal efficiency for the PA in a continuous manner below a medium switchpoint, e.g., of approximately 17 dBm. In these implementations LDO regulator 50 may be digitally controlled, i.e., on or off, depending on whether or not the high power path is enabled. Of course, the digital control of LDO regulator 50 may also be handled directly under the control of the baseband processor.

Thus, in some embodiments, control for the PA may be a mixed approach, where a digital control is provided to transition from HP to MP but from the MP switchpoint (and below), continuous analog control of the output power (i.e., gain) can be provided by a baseband or other processor of a wireless device.

Figure 2:
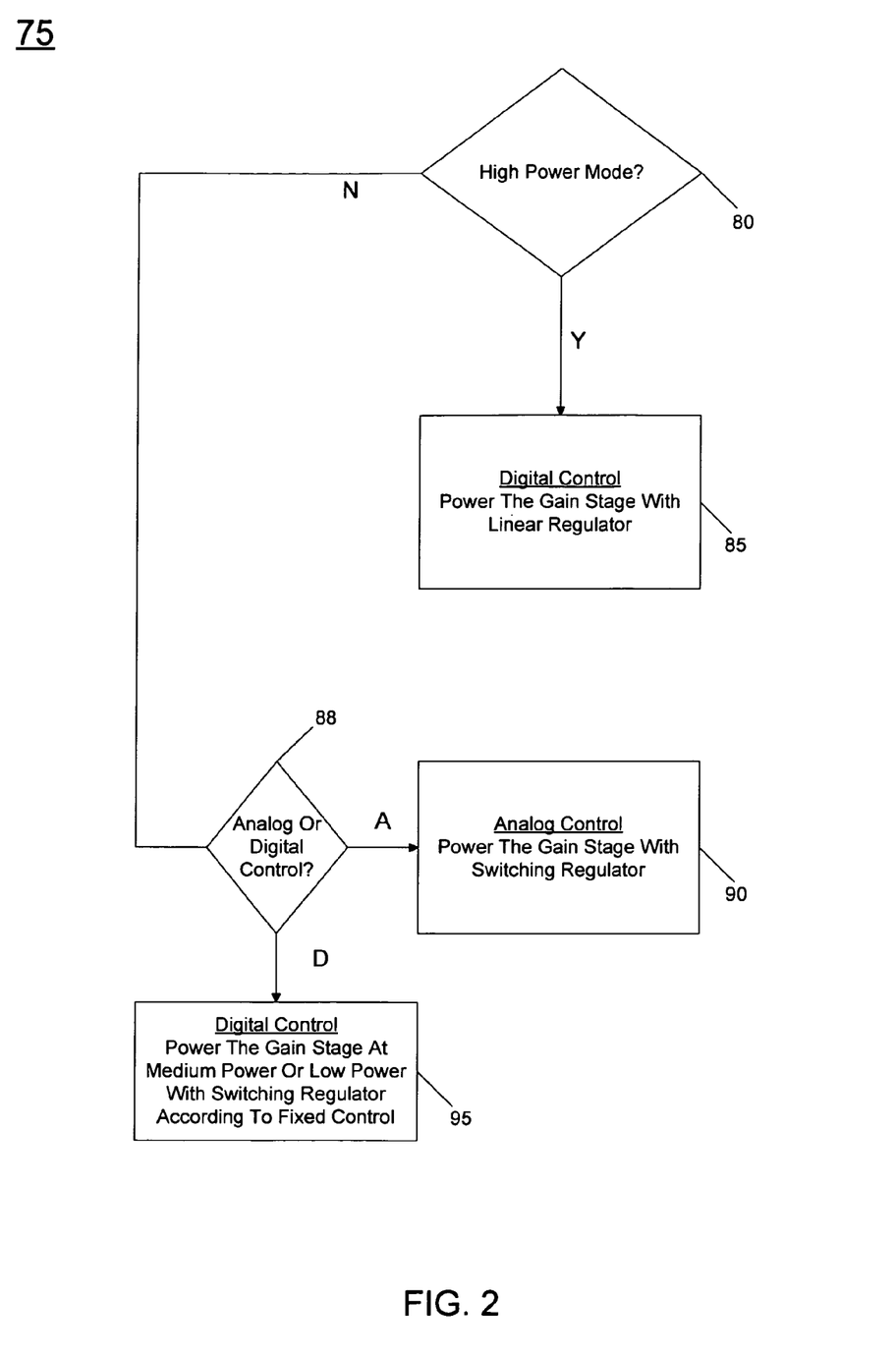
FIG. 2 is a flow diagram of a method of controlling a power amplifier in accordance with one embodiment of the present invention.

Referring now to FIG. 2, shown is a flow diagram of a method of controlling a PA in accordance with one embodiment of the present invention. As shown in FIG. 2, method 75 may be used to control a PA using both digital and analog control. That is, based on information from a baseband processor or other controller of a wireless device, a PA may operate using a regulated voltage of a relatively fixed level, a controllable regulated voltage based on a continuous control mechanism, or both.

As shown in FIG. 2, method 75 may begin by determining whether operation is to be in a high power mode (diamond 80). Such determination may be made based on various control signals received from a baseband processor. For example, an enable signal for high power mode may be received. More specifically, such an enable signal may cause a linear regulator (e.g., an LDO regulator) to power a gain stage (block 85).

Thus this digital control may cause a substantially steady regulated voltage to be provided from the linear regulator. If instead it is determined that operation is not to be in a high power mode, control passes to diamond 88 where it may be determined whether analog or digital control is desired. If analog control is desired, control passes to block 90, where the gain stage may be powered with a switching regulator. This switching regulator may be controlled using continuous analog control such that a variable regulated voltage is provided based on a desired power level (e.g., for MP and below).

If instead at diamond 88 it is determined that digital control is desired, control passes to block 95 where the PA may operate according to digital control, where a gain stage may be powered with the switching regulator at a voltage level corresponding to medium power level or a low power level according to fixed control (i.e., a digital control signal). Note that the all digital or combined analog/digital control of the switching regulator may be based on a configuration of the PA in a system in which a baseband processor may be capable (or incapable) of analog control.

Note that in some implementations, both the linear regulator and the switching regulator may control a single gain stage, or each may power independent gain stages. Note that in the high power mode, the linear regulator may power both gain stages to realize the desired output power level. Still further, in some implementations the gain stages may be separated into multiple parallel paths (a. k. a., slices), each of which can be controlled by an individual associated regulator, which may enable each of the regulators to be formed of relatively small size so that it powers only its corresponding slice. While shown with this particular implementation in the method of FIG. 2, the scope of the present invention is not limited in this regard.

Referring back to the embodiment shown in FIG. 1, different effective loads can be coupled to each of the gain stages, depending upon which gain stage's output is coupled to the load ($R_L$) which, in the embodiment shown in FIG. 1, may be 50 ohms (Ω). Specifically, the output of gain stage 20$_a$ is coupled through a matching capacitance $C_1$ to a first transformer 40, which may have a first turns ratio that enables the output of gain stage 20$_a$ to see a high load impedance such as 50 ohms or even higher, depending on the desired maximum power output for the medium-power mode. In one embodiment, the turns ratio of transformer 40 may be 1:1, although the scope of the present invention is not limited in this regard. The secondary coil of first transformer 40 may be coupled to the output load $R_L$ and a parallel matching capacitance $C_2$. Of course, other manners of coupling the outputs of gain stages 20 to an output load can be realized in other embodiments.

As further shown in FIG. 1, the output of gain stage 20$_b$ is coupled through a matching capacitance $C_3$ to a second transformer 60, which may have a second turns ratio that enables the output of gain stage 20$_b$ to see a much lower impedance, e.g., 4 Ohms, such that the maximum power delivered can be quite high, e.g., 27 dBm as discussed earlier. In one embodiment, the turns ratio of second transformer 60 may be approximately 1:4, although the scope of the present invention is not limited in this regard. The secondary coil of second transformer 60 may be coupled to the output load $R_L$ and a parallel matching capacitance $C_4$. Of course, other manners of coupling the outputs of gain stages 20 to an output load can be realized in other embodiments.

In the embodiment shown in FIG. 1, because switching regulator 30 is only used to power first gain stage 20$_a$ (which as described above operates only at medium or low power levels), it may be sized to be implemented on the same die as the remainder of the PA. In one embodiment, switching regulator 30 may be sized to enable the PA to draw a peak supply current ($I_{supp}$) of approximately 35 to 50 milliamperes (mA). Thus a single die PA (including supplies) can be realized. Because switching DC regulator 30 can be much smaller than one needed to supply current for a high power stage, it is possible to integrate this DC/DC regulator on the CMOS die, including its inductor. Depending on the scaling of the current and the switching frequency, the inductor may be relatively small, and can be integrated on die or on the RDL. In other embodiments, it could be placed on the side of the die in a package including the die. In contrast, conventional PAs that implement a switching regulator typically require at least an off-chip inductor due to the size of such inductor (which may be of the order of microHenry's (uHs)) required for a switching regulator for a high power mode. That is, such a regulator needs to supply a significant current, which can be as large as many hundreds of milliamperes, in high power mode. For example, such implementations can require providing a current of approximately 400 mA. Thus as external DC/DC regulators can be eliminated, and any spurs generated by the on-chip are much smaller than those generated by an external regulator. Typically, the switching frequencies employed by external DC/DC converters are of the order of 1 MHz in these applications. An integrated switching regulator may possibly operate at much higher frequencies—even an order of magnitude or more higher—to enable the integration of the passives needed. While shown with this particular implementation in the embodiment of FIG. 1, other implementations are possible. For example, instead of a single gain stage in each of the high power path and the low power path, some implementations may form these paths of each of multiple slices such that each of these individual slice gain stages may be smaller. Still further, such individual slices may be independently powered by individual regulators (e.g., either linear regulators or switching regulators) that themselves are of a smaller size.

Figure 3A:
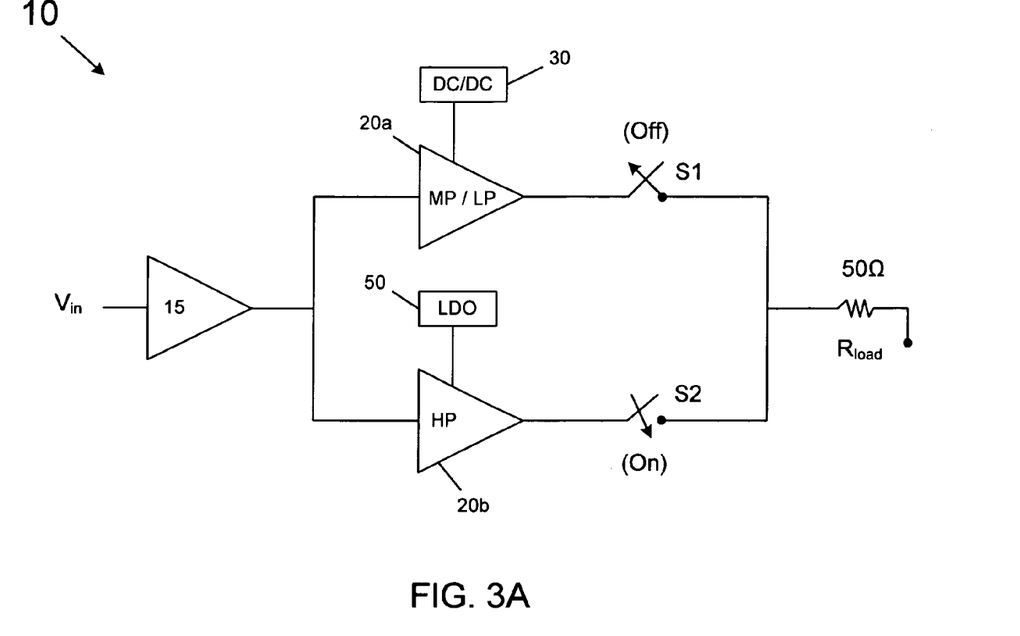
FIGS. 3A and 3B are high level views of a portion of the power amplifier of FIG. 1.
Figure 3B:
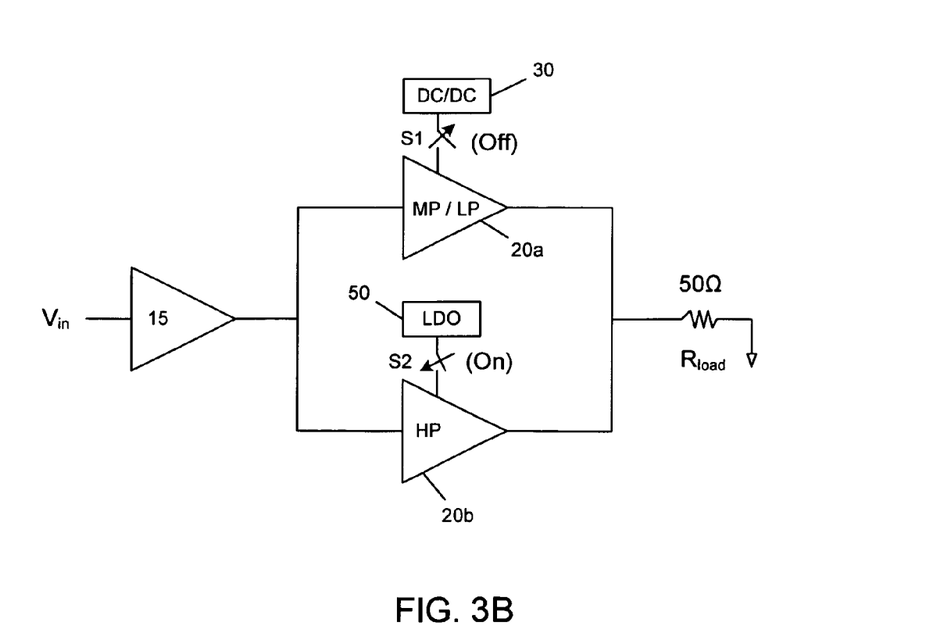

Referring now to FIGS. 3A and 3B, shown are high level views of a portion of the PA of FIG. 1. Specifically, FIG. 3A shows an embodiment incorporating load switching, such as enabled by the output network shown in FIG. 1. The switches conceptually represent the output power combining network formed of the transformers 40 and 60, and the associated capacitors and matching networks. In FIG. 3A, low power gain stage 20$_a$ is off while high power gain stage 20$_b$ is on, as effected by switches S1 and S2, which conceptually detail the operation of the output network shown in FIG. 1. Also in FIG. 3A, a driver stage 15 is coupled to receive the incoming signal and condition it for input to gain stages 20$_a$ and 20$_b$. However, because of the location of the represented switches, losses may occur in both paths regardless of whether a path is enabled. These are the conceptualized losses that, occur in the power combining networks mentioned earlier. Note that the stages shown in FIG. 3A are complementary, and when low power is selected to be controlled, switch S1 may close to provide the low power amplified output of gain stage 20$_a$ to the output load while switch S2 is opened to disable the high power path. While shown for ease of illustration as switches, mechanisms other than a physical switch can be used in different embodiments. For example, control signals from a baseband processor may be used to implement switching. Further, the simplified output network of FIG. 3A can be implemented using a transformer-based network, with appropriate capacitors to couple the outputs of different paths to an output load. Note that in the implementation of FIG. 3 the switches are part of the RF path, which may be impractical.

In contrast, control of gain stages 20$_a$ and 20$_b$ may instead be realized through connection to their supplies. Specifically, as shown in FIG. 3B, switches S1 and S2 are represented as being coupled between the respective supply and the corresponding gain stage. Thus switch S1 is coupled between switching regulator 30 and gain stage $20_a$ and switch S2 is coupled between LDO regulator 50 and gain stage $20_b$. Note that in the implementation shown in FIGS. 3A and 3B, $R_L$ may be 50 ohms. Although not shown, one or more matching networks may be placed between the outputs of the gain stages and the load, RL, to provide a desired drive-point impedance to each gain stage. Some embodiments may have matching networks as shown in FIG. 1.

Figure 4:
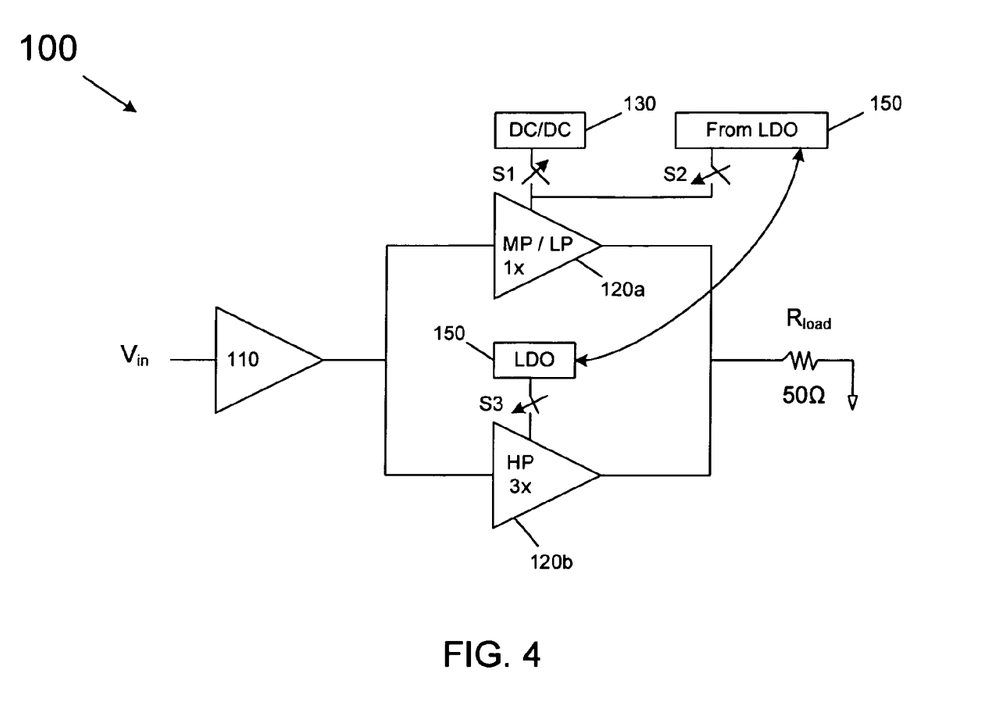
FIG. 4 is a block diagram of a power amplifier in accordance with another embodiment of the present invention.

Referring now to FIG. 4, shown is a block diagram of a power amplifier in accordance with another embodiment of the present invention. As shown in FIG. 4, PA 100 includes a driver stage 110 coupled to receive an incoming signal and condition it for input to parallel gain stages $120_a$ and $120_b$. Although not shown, there may be an inter-stage impedance matching network between the driver stage 110 and the parallel gain stages $120_a$ and $120_b$. In the embodiment of FIG. 4, gain stage $120_a$ may be a medium power/low power gain stage, while gain stage $120_b$ may be a high power gain stage. In one embodiment, gain stage $120_a$ delivers a fraction of the power of gain stage $120_b$, e.g., 33% of the power in high power mode. To enable reuse of gain stage $120_a$ in both high power and medium/low power modes, the gain stages may be implemented such that gain stage $120_a$ is of a first size and gain stage $120_b$ is of a larger size, e.g., 3×. In this way, rather than making a high power gain stage even larger (e.g., 4×), instead gain stage $120_a$ may be controlled to be enabled in both high power and medium/low power modes, realizing a die area savings. These power-levels and sizes of $120_a$ and $120_b$ are meant to be illustrative, and actual sizes will be dependent on the desired high power and medium power settings.

Thus as shown in FIG. 4, a switching regulator 130 is coupled via a switch S1 to gain stage $120_a$ to provide a regulated voltage in a low or medium power mode of operation. In contrast, during a high power mode of operation, LDO regulator 150 is coupled to gain stage $120_b$ via switch S3. In addition, the same LDO regulator 150 is also coupled through switch S2 to provide power to gain stage $120_a$ in the high power mode. In yet other implementations, the HP path can be implemented as multiple parallel stages. In such implementations, one could disable some of the stages selectively in order to reduce the power delivered (while maintaining efficiency). Again, although not shown in FIG. 4, there may be an impedance matching network at the output of the gain stages $120_a$ and $120_b$.

Figure 5:
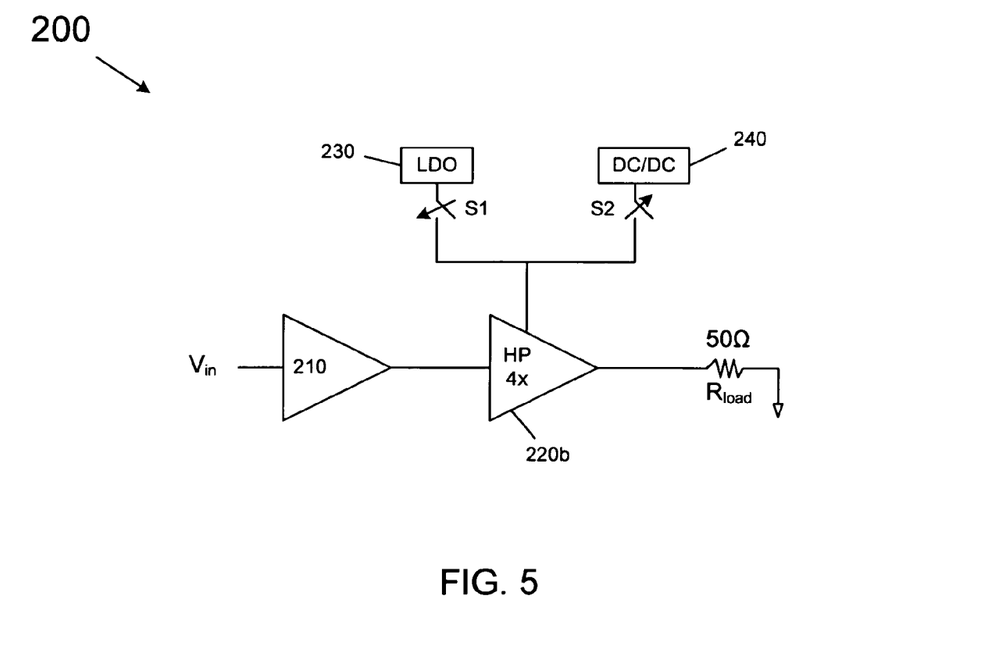
FIG. 5 is a block diagram of a power amplifier in accordance with yet another embodiment of the present invention.

In yet another embodiment, instead of multiple parallel gain stage paths, a single path having a single gain stage may be provided, with a supply voltage for the single gain stage being provided by different regulators in different modes of operation. Specifically, as shown in FIG. 5, which is a block diagram of a PA in accordance with yet another embodiment of the present invention, a gain stage 220, which may be sized to be a high power gain stage, can be powered by a regulated voltage from either of a LDO regulator 230 or a switching regulator 240, under control of switches S1 and S2. In the high level block diagram of FIG. 5, an input signal is coupled to a driver stage 210 that in turn provides a driver output signal to gain stage 220, which, depending upon the mode of operation, provides an amplified output signal of the selected level to an output load. Although not shown, there may be impedance matching networks at the output of the driver stage 210 and at the output of the gain stage 220.

Figure 6:
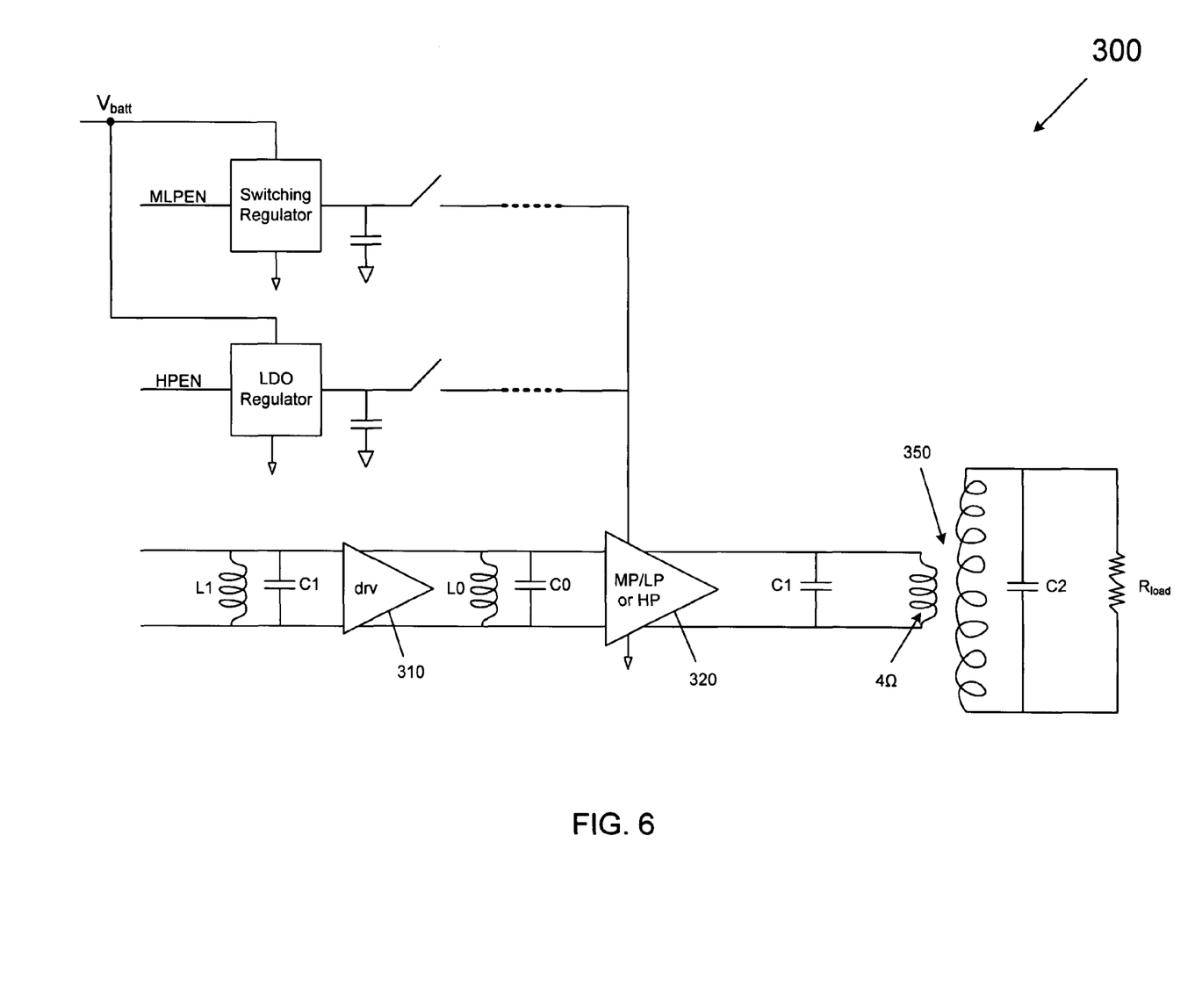
FIG. 6 is a more detailed block diagram of a power amplifier output stage having a single power amplifier path in accordance with an embodiment of the present invention.

Referring now to FIG. 6, shown is a more detailed view of a power amplifier having a single PA path in accordance with an embodiment of the present invention. As shown in FIG. 6, PA 300 includes a gain stage 320 that is coupled to receive the output of a driver stage 310. Note the presence of an input filter circuit formed of an inductor $L_I$ and a capacitance $C_I$ at the input of driver stage 310, and a similar filter circuit coupled between driver stage 310 and gain stage 320, including an inductor $L_O$ and a capacitance $C_O$. Although not explicitly shown, these filters may also provide impedance transformations with transformers, for example. Gain stage 320 is powered by one of a pair of regulators, namely an LDO regulator 330 and a switching regulator 340, only one of which is enabled at a time, depending on the mode of operation, e.g., via control of switches S1 and S2. As shown in the embodiment of FIG. 6, each regulator is coupled to receive a battery voltage $V_{Batt}$, which in one embodiment may range from 4.2 volts to 3 volts or even lower. Each regulator is further coupled to receive an enable signal, which may be received, in one embodiment, from a baseband component to which PA 300 is coupled. Still further, each regulator may have an output filter capacitance $C_{filt}$ coupled in shunt to its output. When enabled, the respective one of switches S1 and S2 is closed to allow the regulated voltage output to be provided to gain stage 320.

Referring still to FIG. 6, the output of gain stage 320 is coupled through a matching capacitance $C_1$ and the primary coil of the output transformer 350, the secondary coil of which is coupled to an output load $R_{load}$, which in one embodiment may be 50 ohms. As further shown, a matching capacitance $C_2$ may also be coupled to the secondary coil of transformer 350. While shown with this particular implementation in the embodiment of FIG. 6, the scope of the present invention is not limited in this regard.

While shown in FIG. 6 with separate switches at the output of the regulators, such switches can be combined and instead switching can be integrated into the (respective) regulator's enable circuitry. That is, the switches at the outputs of the regulators shown in FIG. 6 are one implementation, and instead in other embodiments, switching of the regulators may be realized at the regulators inputs, namely responsive to one or more enable signals from a controller such as a baseband processor or other such component. In such embodiments, when a regulator is disabled it may present an appropriate high impedance state. Also, in such an embodiment, various circuitry coupled to the output of the regulators, such as a filter including only a single $C_{filt}$ capacitance may be provided.

Note one difference between the embodiments of FIG. 1 and that of FIGS. 4 and 5 is that in the first embodiment the output stage/impedance is sized optimally for the MP mode. In the second embodiment, the PA output stage and the drive point impedance is sized for the HP output power, and thus for MP and LP settings, the DC/DC regulator may supply a lower voltage as is appropriate to deliver the required power levels of 17 dBm or 7 dBm. Thus in the first embodiment, the drive point impedance of the gain stage may be substantially equal to the load impedance. In contrast, in the second embodiment, the drive point impedance of the gain stage may be substantially smaller than the load impedance, e.g., on the order of approximately 4 ohms, although the scope of the present invention is not limited in this regard.

Figure 7:
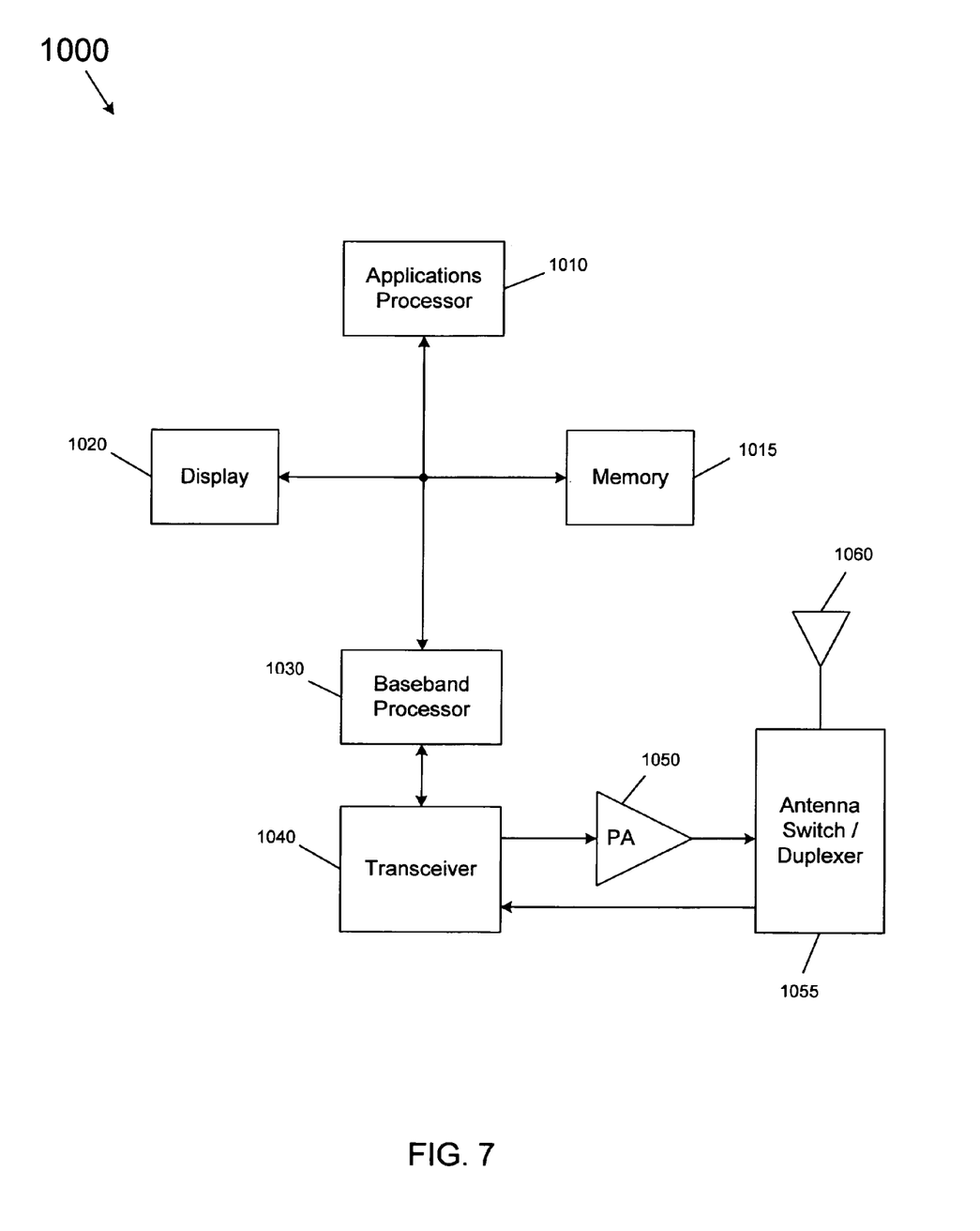
FIG. 7 is a block diagram of a wireless device in accordance with an embodiment of the present invention.

As described above, multiple voltage regulators and control of them in accordance with an embodiment of the present invention can be implemented in a PA such as a CMOS PA. Such a device can be used in various wireless systems, including handsets, mobile devices, PDAs and so forth. Referring now to FIG. 7, shown is a block diagram of a wireless device 1000 in accordance with an embodiment of the present invention. As shown in FIG. 7, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as GSM/EDGE, W-CDMA, or LTE, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes one or more gain stages powered by regulated voltages from both a linear regulator and a switching regulator. Control of the regulators and their output voltage level may be performed by baseband processor 1030. In some embodiments, such control information from baseband processor 1030 may be coupled through transceiver 1040 to PA 1050. In turn, PA 1050 may be coupled to an antenna switch, duplexer or both 1055 which in turn is coupled to an antenna 1060, which radiates the amplified RF signal.

In various embodiments, baseband processor 1030 may send varying control information to PA 1050 to enable it to operate at different power levels, based upon a desired output power level as dictated by different communication schemes. In this way, baseband processor 1030 may perform transmit power control. To do so, in various implementations baseband processor 1030 may send control information to control a supply voltage to be provided to one or more gain stages of PA 1050 for it to output RF signals at a selected power level. For example, in some communication schemes a high power transmit mode may be realized by controlling PA 1050 to operate its gain stage(s) at a fixed maximum supply voltage level. In the embodiments described above, such fixed maximum supply voltage level may be generated using an LDO regulator. In contrast, the gain stage(s) of PA 1050 may also be controlled, e.g., for medium or low power communications, to operate at a varying lower supply voltage such that a desired output power level is achieved while maintaining maximum efficiency. In various implementations this lower supply voltage level may be supplied using a switching regulator that can be controlled either continuously or digitally based on information from baseband processor 1030.

As further shown in FIG. 7, in a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 7, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first gain stage to receive a first incoming signal and to output a first amplified signal;
   a linear regulator coupled to the first gain stage to provide a first regulated voltage to the first gain stage;
   a second gain stage to receive a second incoming signal and to output a second amplified signal;
   a switching regulator coupled to the second gain stage to provide a second regulated voltage to the second gain stage; and
   an output network coupled to the first and second gain stages to switchably couple one of the first and second amplified signals to an output load, the output network including a first transformer having a first turns ratio coupled to the first gain stage and a second transformer having a second turns ratio coupled to the second gain stage, the first turns ratio greater than the second turns ratio to provide a different effective output load to the first and second gain stages.

2. The apparatus of claim 1, wherein the first regulated voltage is switchably coupled to the first gain stage when the apparatus is in a high power mode and the second regulated voltage is switchably coupled to the second gain stage when the apparatus is in a medium or low power mode.

3. The apparatus of claim 2, wherein the linear regulator is further coupled to the second gain stage to provide the first regulated voltage to the second gain stage when the first gain stage is enabled.

4. The apparatus of claim 2, wherein only a single one of the first and second gain stages is to be enabled at a time, under control of a baseband processor coupled to the apparatus.

5. The apparatus of claim 1, wherein the linear regulator is controlled to provide the first regulated voltage at a fixed level and the switching regulator is controlled to provide the second regulated voltage at a variable level.

6. The apparatus of claim 1, wherein the linear regulator, the switching regulator and the first and second gain stages are adapted on a single semiconductor die.

7. A power amplifier comprising:
   an amplifier to receive an incoming signal and to output an amplified signal;
   a low dropout (LDO) regulator switchably coupled to the amplifier to provide a first regulated voltage to the amplifier, the LDO regulator configured to receive a digital control signal and to provide the first regulated signal responsive to the digital control signal; and
   a switching regulator switchably coupled to the amplifier to provide a second regulated voltage to the amplifier, the switching regulator configured to receive a second digital control signal and an analog control signal and to provide the second regulated voltage responsive to a received one of the second digital control signal and the analog control signal.

8. The power amplifier of claim 7, wherein the LDO regulator and the switching regulator are coupled in parallel to the amplifier, and wherein a single one of the LDO regulator and the switching regulator is enabled at a time.

9. The power amplifier of claim 8, further comprising an output network coupled to the amplifier, wherein the output network includes a single transformer.

10. The power amplifier of claim 9, further comprising a shared circuit coupled to the switching regulator and the LDO regulator, the shared circuit including a shared filter to filter the first and second regulated voltages.

11. The power amplifier of claim 9, wherein the LDO regulator is switchably coupled to the amplifier via an enable signal to enable the LDO regulator, wherein the enable signal is to be received from a baseband processor.

12. The power amplifier of claim 9, wherein a drive point impedance of the amplifier is substantially less than an impedance of an output load coupled to the output network.

13. The power amplifier of claim 7, further comprising a second amplifier in a second path parallel to a first path including the amplifier, wherein the LDO regulator is switchably coupled to the second amplifier, and wherein the LDO regulator is switchably coupled to the amplifier when the power amplifier is in a high power mode and is otherwise uncoupled to the amplifier.

14. The power amplifier of claim 13, further comprising an output network coupled to the amplifier and the second amplifier to switchably couple one of the amplifier and the second amplifier to an output load, the output network including a first transformer having a first turns ratio coupled to the amplifier and a second transformer having a second turns ratio coupled to the second amplifier, the first turns ratio greater than the second turns ratio to provide a different effective output load to the first amplifier and the second amplifier.

15. A method comprising:
controlling a power amplifier to output a first power level according to a digital control signal, wherein the power amplifier is powered by a linear regulator under control of the digital control signal; and
controlling the power amplifier to output a second power level less than the first power level according to an analog control signal, wherein the power amplifier is powered by a switching regulator under control of the analog control signal.

16. The method of claim 15, further comprising powering a first gain stage of the power amplifier using the linear regulator and powering a second gain stage of the power amplifier using the switching regulator.

17. The method of claim 16, further comprising coupling an output of the first gain stage to an output load via a first transformer and coupling an output of the second gain stage to the output load via a second transformer.

18. The method of claim 15, further comprising receiving the digital control signal and the analog control signal from a baseband processor coupled to the power amplifier.

19. The method of claim 18, further comprising varying an output voltage of the switching regulator responsive to the analog control signal.

20. The method of claim 15, further comprising controlling the power amplifier to output the second power level according to a second digital control signal, and to output a third power level according to a third digital control signal, the third power level less than the second power level.

21. A system comprising:
a baseband processor to control operation of the system;
a transceiver coupled to the baseband processor to receive baseband information and to generate a radio frequency (RF) signal; and
a power amplifier (PA) coupled to the transceiver to receive and amplify the RF signal to a transmit power level under control of the baseband processor, wherein the PA includes at least one gain stage to operate using a first supply voltage to output the RF signal at a first power level and to operate using a second supply voltage to output the RF signal at a second power level, the first supply voltage at a fixed level and the second supply voltage at a variable level less than the fixed level, the first power level greater than the second power level, wherein the baseband processor is to control the PA to output at the first power level according to a digital control signal, wherein the PA is powered by a linear regulator under control of the digital control signal, and control the PA to output at the second power level according to an analog control signal, wherein the PA is powered by a switching regulator at the second power level.

22. The system of claim 21, wherein the baseband processor is to control the PA to output at the second power level according to a second digital control signal, and to output at a third power level according to a third digital control signal, the third power level less than the second power level.

23. The system of claim 21, wherein the PA includes an amplifier to amplify the RF signal, the linear regulator switchably coupled to the amplifier to provide the first supply voltage, and the switching regulator switchably coupled to the amplifier to provide the second supply voltage.

* * * * *